United States Patent [19]

Nakamura et al.

[11] 4,339,765
[45] Jul. 13, 1982

[54] TRANSISTOR DEVICE

[75] Inventors: Junichi Nakamura; Seiji Hata, both of Oita; Iwao Yamasaki, Kitakayushu, all of Japan

[73] Assignee: Tokyo Shibaura Denki Kabushiki Kaisha, Japan

[21] Appl. No.: 156,370

[22] Filed: Jun. 4, 1980

[30] Foreign Application Priority Data

Jun. 12, 1979 [JP] Japan ............................ 54-73874

[51] Int. Cl.³ .................................... H01L 29/06
[52] U.S. Cl. ..................................... 357/36; 357/35; 357/40; 357/46; 357/55
[58] Field of Search ................. 357/36, 35, 40, 46, 357/55

[56] References Cited

U.S. PATENT DOCUMENTS 3,958,267  5/1976  Frederiksen et al. ............. 357/36
3,987,477 10/1976  Krolik ................................ 357/36

Primary Examiner—Edward J. Wojciechowicz
Attorney, Agent, or Firm—Finnegan, Henderson, Farabow, Garrett & Dunner

[57] ABSTRACT

A lateral type multi-collector transistor which has a first collector region which subtends an angle $\theta_1$ at the center of the emitter region and which has an effective plane distance $W_{B1}$ from this center; and a second collector region which subtends an angle of $\theta_2$ at the center of the emitter region and which has an effective plane distance $W_{B2}$ from this center such that $\theta_1 < \theta_2$ and $W_{B1} > W_{B2}$.

3 Claims, 9 Drawing Figures

TRANSISTOR DEVICE

BACKGROUND OF THE INVENTION

The present invention relates to a lateral type transistor, and more particularly to a transistor device having a multi-collector or a multi-emitter structure.

A lateral transistor which has a plurality of collectors and one emitter is used in electric equipments such as power sources. However, depending on the use of such power source devices, the current-amplification factor of each collector is required to be varied from one to the next. For this purpose, the current-amplification factor is generally changed by varying the shape of each collector region. However, with this method, the shape of the collector region must be made greater in order to have a greater current-amplification factor. Consequently, the transistor itself must be made larger, adversely affecting the packing density of the integrated circuits.

Similar problems exist with transistors of multi-emitter structure as in the case of transistors of multi-collector structure.

SUMMARY OF THE INVENTION

The primary object of the present invention is, therefore, to provide a transistor device wherein the area of the transistor device can be made small without enlarging the collector region or the emitter region, even when the current-amplification factor for each collector or emitter of a lateral type multi-collector or multi-emitter transistor changes significantly from one to the next, thereby facilitating high packing density.

To the above and other ends, the present invention provides a transistor device comprising a semiconductor substrate of one conductivity type; a first region of a conductivity type opposite to that of the substrate, formed on a main surface of the semiconductor substrate; at least two second regions of a conductivity type opposite to that of the substrate, formed on the main surface separately of the first region, such that the effective plane distance between one of these second regions and the first region is set to be different from the distance between the other of these second regions and the first region; and a base region which is formed on said one main surface and in which are formed the first region and the second regions separately of one another.

DETAILED DESCRIPTION OF THE PREFERRED EMBODIMENTS

Figure 1:
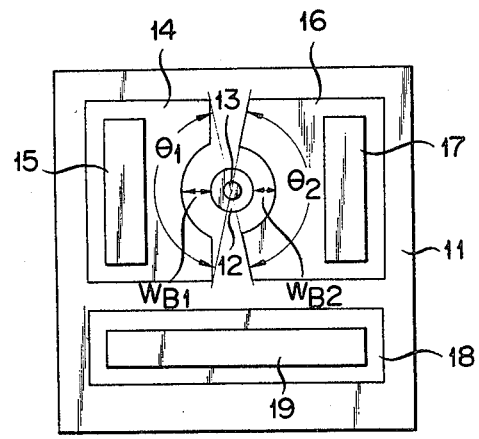
FIG. 1 is a plan view of an embodiment of a lateral multi-collector transistor in accordance with the present invention.

FIG. 1 shows a lateral type pnp multi-collector transistor in accordance with one embodiment of the present invention in which two collector regions are formed. In FIG. 1, an emitter region 12 of a substantially circular surface shape is formed by diffusion on a main surface of an n-type semiconductor substrate 11. An emitter contact 13 is formed at the center of the surface of the emitter region 12. A first p-type collector region 14 has an arc-shaped side periphery formed equidistantly from and in opposition to the outer periphery of the emitter region 12. A collector contact 15 is formed on the first collector region 14.

Figure 2:
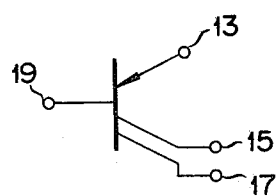
FIG. 2 is a symbolic representation of the transistor shown in FIG. 1.

A second p-type collector region 16 of an area slightly greater than that of the region 14 is formed opposite the collector region 14 with the emitter region 12 therebetween. The collector region 16 also has an arc-shaped side periphery which is formed equidistantly from and in opposition to the outer periphery of the emitter region 12. These regions are so formed that $W_{B1} > W_{B2}$, where the effective plane distance between the emitter region 12 and the first collector region 14 is $W_{B1}$ and the effective plane distance between the emitter region 12 and the second collector region 16 is $W_{B2}$. A rectangular base diffusion region 18 is formed separately of the emitter region 12 and the collector regions 14 and 16 on the substrate 11, and a base contact 19 is formed thereon. A symbolic representation of the lateral type multi-collector transistor thus manufactured is shown in FIG. 2, and the same contact reference numerals in FIG. 1 denote the corresponding electrode terminals of FIG. 2.

Figure 3:
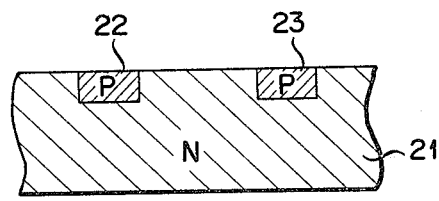
FIG. 3 is a sectional view illustrating the structure of a conventional lateral type transistor.

Before considering the current-amplification factors $h_{FE1}$ and $h_{FE2}$ of the collectors 14 and 16, respectively, of the multi-collector transistor of FIG. 1, the current-amplification factor $h_{FE}$ of a lateral type transistor of general structure will be described referring to FIG. 3. In FIG. 3, an emitter region 22 and a collector region 23 of p-type are formed by diffusion, with a predetermined space therebetween, on a main surface of an n-type semiconductor substrate 21 so as to form a pnp transistor. The current-amplification factor $h_{FE}$ of the lateral type pnp transistor of this construction is in general given by the following equation (1), since carriers are only injected from the region 22 to the region 23:

$$\frac{1}{h_{FE}} \approx \frac{1}{\alpha} \left( \frac{\rho_{SE} \cdot W_B}{\rho_B} + \frac{W_B^2}{2L_{pb}^2} + \frac{S \cdot A_s \cdot W_B}{A_L \cdot D_{pb}} \right) \quad (1)$$

where
- $\alpha$: constant generally determined by a configuration of the transistor
- $\rho_B$: specific resistance of the base region
- $\rho_{SE}$: sheet resistance of the emitter region $W_B$: effective base width
$L_{pb}$: diffusion constant of the holes of the base region
$A_L$: area of the emitter region
$D_{pb}$: diffusion constant of the holes of the base region
$S$: recombination at the surface of the substrates
$A_s$: effective area of recombination at the surface Accordingly, the current-amplification factors $h_{FE1}$ and $h_{FE2}$ of the collector regions 14 and 16 in the embodiment of FIG. 1 can be given by the following equations (2) and (3) by utilizing the equation (1):

$$\frac{1}{h_{FE1}} \approx \frac{1}{\alpha_1}\left(\frac{\rho_{SE} \cdot W_{B1}}{\rho_B} + \frac{W_{B1}^2}{2L_{pb}^2} + \frac{S \cdot A_s \cdot W_{B1}}{A_L \cdot D_{pb}}\right) \quad (2)$$

$$\frac{1}{h_{FE2}} \approx \frac{1}{\alpha_2}\left(\frac{\rho_{SE} \cdot W_{B2}}{\rho_B} + \frac{W_{B2}^2}{2L_{pb}^2} + \frac{S \cdot A_s \cdot W_{B1}}{A_L \cdot D_{pb}}\right) \quad (3)$$

$W_{B1}$ and $W_{B2}$ are the effective base widths of the transistor with reference to each of the collector regions 14 and 16: they are, respectively, the effective plane distance between the emitter 12 and the collector region 14, and the effective plane distance between the emitter 12 and the collector region 16 in FIG. 1. As is described hereinbefore, the relation $W_{B1} > W_{B2}$ is established for the effective plane distances $W_{B1}$ and $W_{B2}$. This relation is obtained when the dimensions of the mask holes for the regions 14 and 16 are made equal in FIG. 1 and when the diffusion time of the region 16 is made longer than that of the region 14. It is, of course, to be understood that the dimensions of the diffusion mask may alternatively be made larger than that of the region 16.

Figure 4:
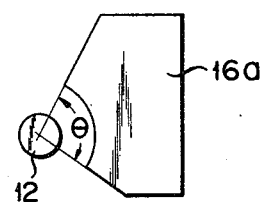
FIG. 4 illustrates the pattern of a modification of one of the collector regions in the embodiment shown in FIG. 1.

In equations (2) and (3), $\alpha_1$ and $\alpha_2$ are constants determined by the angles $\theta_1$ and $\theta_2$ subtended by the collectors 14 and 16 at the center of the emitter region 12. The constant $\alpha_1$ is given by $\alpha_1 = \theta_1/360°$, and the constant $\alpha_2$ is given by $\alpha_2 = \theta_2/360°$. For example, when collector region 16a is of the shape shown in FIG. 4, the angle of this with respect to the emitter region 12 is $\theta$ as shown, and the constant $\alpha$ is given by $\alpha = \theta/360°$.

As may be understood from equations (2) and (3), the current-amplification factors $h_{FE1}$ and $h_{FE2}$ can be varied by changing the constants $\alpha_1$ and $\alpha_2$ or by changing the effective base widths $W_{B1}$ and $W_{B2}$. In the method of changing the current-amplification factor $h_{FE}$ by changing the constant $\alpha$, when the value of $\alpha_2$, (or the value of $\theta_2$) is set to be twice that of $\alpha_1$, (twice $\theta_1$), $h_{FE}$ becomes only twice $h_{FE1}$. On the other hand, in the method of changing the effective base width $W_B$, the current-amplification factor changes widely. This will be described below. In equation (1), when the values of $\rho_{SE} \cdot W_B$, $\rho_B$, $S$, $A_s$, $A_L$ and $D_{pb}$ are given as, $\rho_{SE} = 150$ $\Omega/cm^3$, $W_B = 4 \times 10^{-12}$m, $\rho_B = 2\Omega$-cm, $S = 100$ cm/sec, $A_s$ $A_L$ and $D_{pb} = 10$ cm$^3$/sec, terms of the equation (1) will be given as follows:

$$\frac{\rho_{SE} \cdot W_B}{\rho_B} = \frac{150(\Omega/cm^3) \times 4 \times 10^{-12}(m)}{2(\Omega - cm)} = 3.0 \times 10^{-2}$$

$$\frac{S \cdot A_s \cdot W_B}{A_L \cdot D_{pb}} = \frac{100(cm/sec) \times 4 \times 10^{-12}(m)}{10(cm^3/sec)} = 4 \times 10^{-3}$$

Thus, these terms may be negligible. Hence, equation (1) may be rewritten as equation (4) below:

$$1/h_{FE} \approx 1/\alpha \cdot W_B^2/2L_{pb}^2 \quad (4)$$

It is seen from equation (4) that $h_{FE}$ becomes $\frac{1}{4}$ when the effective base width is doubled. When $W_B$ is tripled, $h_{FE}$ becomes 1/9 its original value. For example, in the embodiment of FIG. 1, when the effective base width $W_{B1}$ is double the value of $W_{B2}$ after substantially equalizing $\alpha_1$ and $\alpha_2$, the current-amplification factor $h_{FE2}$ becomes about four times the value of $h_{FE1}$.

As may be seen from equation (4), it suffices to change the effective base width $W_B$ together with the value of $\alpha$ in order to widely change the current-amplification factor $h_{FE}$.

Figure 5:
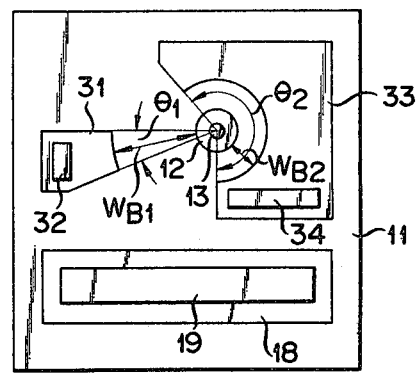
FIG. 5 is a view illustrating the plane pattern of another embodiment of the lateral type multi-collector transistor in accordance with the present invention.

An embodiment based on this principle will be described hereinafter referring to FIG. 5. In FIG. 5, the same numerals denote the same parts as in FIG. 1. In the drawing, one collector region 31 is formed relatively small, and the angle $\theta_1$ subtended by it at the center of the emitter region 12 is small, for example, 36°. Numeral 32 is a collector contact formed in the collector region 31. On the other hand, the other emitter region is so formed that the angle $\theta_2$ formed by a collector region 33 with respect to the center of the emitter region 12 is large, for example, 200°. Numeral 34 denotes a collector contact formed in the collector region 33. The effective plane distance between the emitter region 12 and the collector region 31, that is, the effective base width $W_{B1}$, is set to be three times the effective plane distance between the emitter region 12 and the other collector region 33, that is, the effective base width $W_{B2}$.

The ratio of the current-amplification factor $h_{FE1}$ of the collector region 31 to the current-amplification factor $h_{FE2}$ of the other collector region 33 will be examined using equation (4). The following equations are obtained when $h_{FE1}$ and $h_{FE2}$ are replaced by $\theta_1$, $\theta_2$, $W_{B1}$ and $W_{B2}$:

$$\frac{1}{h_{FE1}} \approx \left(\frac{360}{36}\right) \cdot \frac{(3W_{B2})^2}{2L_{pb}^2} \quad (5)$$

$$\frac{1}{h_{FE2}} \approx \left(\frac{360}{200}\right) \cdot \frac{W_{B2}^2}{2L_{pb}^2} \quad (6)$$

Dividing equation (6) by equation (5) gives a value for $h_{FE1}/h_{FE2}$ of 1/50. That is, the value of $h_{FE2}$ is as much as fifty times thhe value of $h_{FE1}$.

Figure 6:
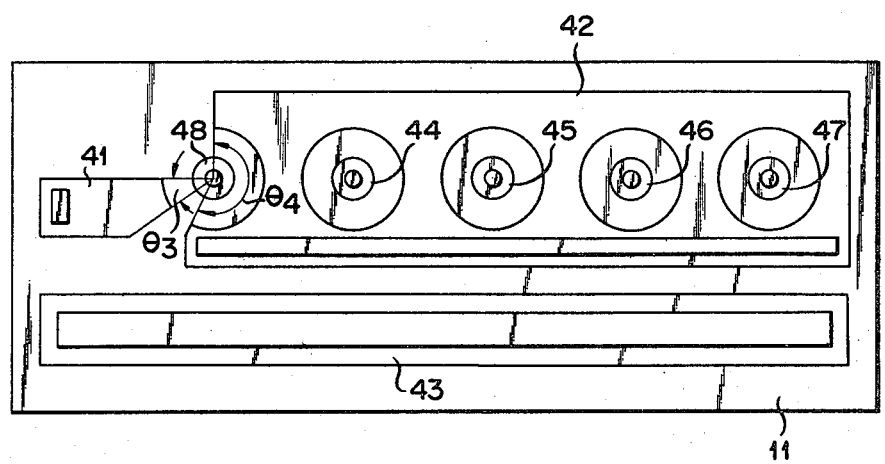
FIG. 6 is a view illustrating the plane pattern of the lateral type multi-collector transistor when a conventional method is adopted in order to obtain the same current-amplification factor as derived in the device of FIG. 5.

On the other hand, in order to derive a value of $h_{FE2}$ fifty times the value of $h_{FE1}$ by changing the value of $\alpha$ only, $\theta_2$ must be 1,650° when the value of $\theta_1$ is 33°, as may be seen from equations (2) and (3). Since $1,650°/360° = 4 + 210/360$, this requires a part including four emitter regions completely surrounded by a single collector region and another part including another emitter region surrounded through only 210° by the same single collector region. A multi-collector transistor of such a construction has a two-dimensional pattern as shown in FIG. 6. In FIG. 6, numeral 41 denotes one collector region having a small current-amplification factor $h_{FE1}$; 42, the other collector region having a great current-amplification factor $h_{FE2}$; and 43, a base diffusion region. In order to satisfy the condition of $\theta_2 = 1,650°$ with $W_{B1} = W_{B2}$, the collector region 42 is formed so as to completely surround four emitter regions 44, 45, 46 and 47 and to surround part of another emitter region 48 through 210° which is the value of $\theta_4$.

The angle collector region 41 subtends at the center of the emitter region 48 is 33°.

Thus, as may be apparent from a comparison between FIGS. 5 and 6, the embodiment shown in FIG. 5 provides a lateral type multi-collector transistor having a great current-amplification factor ratio of 1:50 without enlarging the element area.

Figure 7:
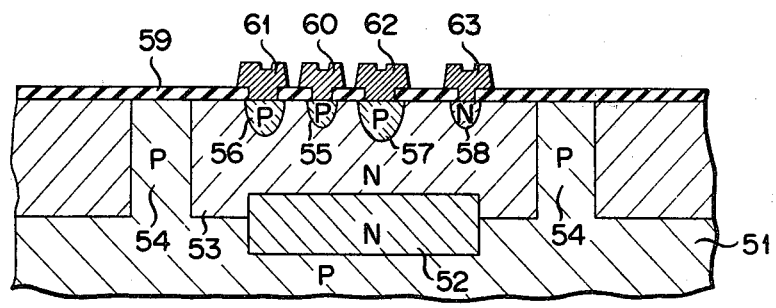
FIG. 7 is a sectional view illustrating elements of an embodiment in which a predetermined effective base width between the emitter and the collectors is secured.

In manufacturing a lateral type multi-collector transistor, it is possible to change the effective plane distance between the emitter region and each collector region by changing the diffusion depth in forming each collector region by diffusion. FIG. 7 is a sectional view illustrating the construction of a lateral pnp-type multi-colletor transistor having two collectors manufactured by this method. In FIG. 7, an n-type embedded region 52 is formed inside a p-type silicon single crystal substrate 51, and an n-type epitaxial region 53 is formed on this embedded region 52. A p-type insulating and isolating region 54 surrounds the epitaxial region 53. A p-type emitter region 55 is formed on the surface of the epitaxial region 53. Two collector regions 56 and 57 and an n-type base diffusion region 58 are formed at the sides of the emitter region 55. Of the two, the collector region 57 is formed by diffusion deeper than the collector region 56. As is well known, the diffusion of the collector region 57 progresses in the vertical direction of the region 53 as well as in the transverse direction, that is, the direction along the surface of the region 53. Consequently, the effective plane distance between the emitter region 55 and the collector region 57 may be made shorter than that between the regions 55 and 56. It is known, in this instance, how to control with precision the progress of the diffusion process by appropriately determining the diffusion temperature, the kind of impurity to be diffused, and the material of the substrate. Therefore, the effective plane distance may be correctly and easily set by general techniques. In FIG. 7, numeral 59 denotes an insulating oxidized film; and 60, 61, 62 and 63 each denote contact electrodes.

Although the above embodiment has been described with reference to pnp-type multi-collector transistors, the present invention is applicable to npn-type multi-collector transistors. Further, although two collectors were formed in the above description, three or more collectors may be formed in a similar manner. The present invention is further applicable not only to multi-collector transistors but also to lateral type multi-emitter transistors.

Figure 8:
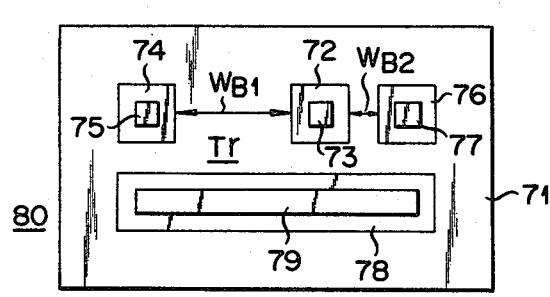
FIG. 8 is a pattern view illustrating an embodiment of a lateral type multi-emitter transistor manufactured in accordance with the present invention.
Figure 9:
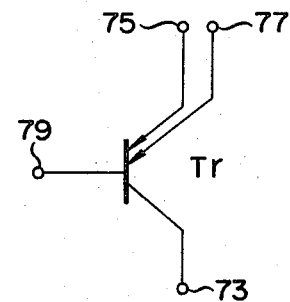
FIG. 9 is a symbolic representation of the multi-emitter transistor shown in FIG. 8.

FIG. 8 shows the two-dimensional pattern of an embodiment which adopts the present invention for a lateral type multi-emitter transistor. FIG. 9 symbolically shows the same. In FIG. 8, a p-type collector region 72 is formed on a main surface of an n-type silicon semiconductor substrate 71, and a collector contact 73 is formed on the collector region 72. A first p-type emitter region 74 is formed at the effective plane distance $W_{B1}$ from the collector region 72, and an emitter contact 75 is formed thereon. A second emitter region 76 is formed at the effective plane distance $W_{B2}$ from the collector region 72 in the opposite direction from the emitter region 74 and an emitter contact 77 is formed thereon. An n-type base region 78 is formed on the main surface of the substrate, and a base contact 79 is formed thereon. An isolator layer 80 is formed around the lateral type multi-emitter transistor Tr of this construction for insulation from other elements. In the symbolic representation of FIG. 9, the collector contact 73, the emitter contacts 75 and 77 and the base contact 79 correspond to those in FIG. 8.

In the embodiment shown in FIG. 8, the effective plane distance $W_{B1}$ between the collector region 72 and the first emitter region 74 is set to be four times the other effective plane distance $W_{B2}$. Since equation (4) is satisfied in this embodiment, the current at the emitter region 76 is 16 times the current at the emitter region 74.

What we claim is:

1. A transistor device comprising:
   a semiconductor substrate of one conductivity type;
   a base region formed on a main surface of said substrate;
   a first region formed on said main surface in said base region, said first region being of a conductivity type opposite to that of said substrate;
   at least two second regions formed on said main surface in said base region separately from said first region, said second regions being of a conductivity type opposite to that of said substrate, the diffusion depth of at least one of said second regions being greater than the diffusion depth of at least another of said second regions, and the effective plane distance between said at least one of said second regions and said first region being different from the effective plane distance between the said another of said second regions and the first region.

2. A transistor device as claimed in claim 1, wherein said first region is a collector region, and said second regions are emitter regions.

3. A transistor device as claimed in claim 1, wherein said first region is an emitter region and said second regions are collector regions.

* * * * *